United States Patent
Angell, IV et al.

(10) Patent No.: US 9,382,151 B2
(45) Date of Patent: Jul. 5, 2016

(54) LOW EXPANSION SILICA-TITANIA ARTICLES WITH A $T_{zc}$ GRADIENT BY COMPOSITIONAL VARIATION

(71) Applicant: Corning Incorporated, Corning, NY (US)

(72) Inventors: William R. Angell, IV, Painted Post, NY (US); Sezhian Annamalai, Painted Post, NY (US); Carlos Alberto Duran, Ottawa (CA); John Edward Maxon, Canton, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/604,998

(22) Filed: Jan. 26, 2015

(65) Prior Publication Data

US 2015/0218039 A1 Aug. 6, 2015

Related U.S. Application Data

(60) Provisional application No. 61/934,276, filed on Jan. 31, 2014.

(51) Int. Cl.
*C03C 3/06* (2006.01)
*C03C 3/076* (2006.01)
(Continued)

(52) U.S. Cl.
CPC ........... *C03C 3/076* (2013.01); *C03B 19/09* (2013.01); *C03B 19/1407* (2013.01);
(Continued)

(58) Field of Classification Search
CPC .... C03C 2201/06; C03C 2201/42; C03C 3/06
USPC .......................................................... 501/54
See application file for complete search history.

(56) References Cited

U.S. PATENT DOCUMENTS

| 5,154,744 A | 10/1992 | Blackwell et al. |
| 6,465,511 B1 | 10/2002 | Kazmierski et al. |

(Continued)

FOREIGN PATENT DOCUMENTS

| DE | 102013221378 | 5/2014 |
| EP | 2385024 | 11/2011 |

(Continued)

OTHER PUBLICATIONS

International Search Report, issued in connection with corresponding PCT application No. PCT/US2015/013417, Jan. 29, 2015, mailed May 4, 2015.

*Primary Examiner* — Noah Wiese
(74) *Attorney, Agent, or Firm* — Kevin L. Bray

(57) ABSTRACT

A glass article for use in Extreme Ultra-Violet Lithography (EUVL) is provided. The glass article includes a silica-titania glass having a compositional gradient through the glass article, the compositional gradient being defined by the functions:

$$[TiO_2] = (c + f(x,y,z)), \text{ and}$$

$$[SiO_2] = (100 - \{c + f(x,y,z)\} - \delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature ($T_{zc}$), $f(x, y, z)$ is a function in three-dimensional space that defines the difference in average composition of a volume element centered at the coordinates (x, y, z) with respect to c, and $\delta(x, y, z)$ is a function in three-dimensional space that defines the sum of all other components of a volume element centered at the coordinates (x, y, z).

14 Claims, 4 Drawing Sheets

(51) Int. Cl.
  *C03B 19/09* (2006.01)
  *C03C 3/062* (2006.01)
  *C03B 19/14* (2006.01)
  *G03F 1/24* (2012.01)

(52) U.S. Cl.
  CPC .............. *C03B 19/1415* (2013.01); *C03C 3/06* (2013.01); *C03C 3/062* (2013.01); *G03F 1/24* (2013.01); *C03B 2201/42* (2013.01); *C03B 2207/50* (2013.01); *C03C 2201/23* (2013.01); *C03C 2201/42* (2013.01); *C03C 2203/10* (2013.01); *C03C 2203/40* (2013.01)

(56) References Cited

U.S. PATENT DOCUMENTS

| | | |
|---|---|---|
| 6,487,879 B1 | 12/2002 | Blackwell et al. |
| 6,542,224 B2 | 4/2003 | Ackerman et al. |
| 6,576,380 B2 | 6/2003 | Davis, Jr. et al. |
| 6,606,883 B2 * | 8/2003 | Hrdina ............... C03B 19/1407 65/17.4 |
| 6,829,908 B2 | 12/2004 | Bowden et al. |
| 6,931,097 B1 | 8/2005 | Davis, Jr. et al. |
| 6,988,377 B2 | 1/2006 | Bernas et al. |
| 6,997,015 B2 | 2/2006 | Bowden et al. |
| 7,053,017 B2 | 5/2006 | Hrdina et al. |
| 7,155,936 B2 | 1/2007 | Dawes et al. |
| RE40,586 E | 11/2008 | Hrdina et al. |
| 7,506,521 B2 | 3/2009 | Bookbinder et al. |
| 7,506,522 B2 | 3/2009 | Bleaking et al. |
| 7,589,040 B2 | 9/2009 | Dawes et al. |
| RE41,220 E | 4/2010 | Davis, Jr. et al. |
| 7,928,026 B2 | 4/2011 | Bookbinder et al. |
| 7,939,457 B2 | 5/2011 | Hrdina et al. |
| 8,021,755 B2 | 9/2011 | Hrdina et al. |
| 8,047,023 B2 | 11/2011 | Ackerman et al. |
| 8,268,740 B2 | 9/2012 | Fiacco et al. |
| 8,328,417 B2 | 12/2012 | Duran et al. |
| 8,541,325 B2 | 9/2013 | Duran et al. |
| 8,596,094 B2 | 12/2013 | Duran et al. |
| 2002/0157420 A1 | 10/2002 | Hrdina et al. |
| 2009/0143213 A1 | 6/2009 | Hrdina et al. |
| 2011/0048075 A1 | 3/2011 | Duran et al. |
| 2011/0052869 A1 | 3/2011 | Hrdina et al. |
| 2011/0207593 A1 | 8/2011 | Duran et al. |
| 2012/0264584 A1 * | 10/2012 | Miyasaka ............. B82Y 10/00 201/53 |
| 2013/0052391 A1 | 2/2013 | Annamalai |

FOREIGN PATENT DOCUMENTS

| | | |
|---|---|---|
| WO | 03077038 | 9/2003 |
| WO | 2005082800 | 9/2005 |
| WO | 2011138340 | 11/2011 |

* cited by examiner

LOW EXPANSION SILICA-TITANIA ARTICLES WITH A $T_{zc}$ GRADIENT BY COMPOSITIONAL VARIATION

This application claims the benefit of priority under 35 U.S.C. §119 of U.S. Provisional Application Ser. No. 61/934,276 filed on Jan. 31, 2014, the content of which is relied upon and incorporated herein by reference in its entirety.

FIELD

The present disclosure is directed to low thermal expansion silica-titania glass articles, and more particularly to low thermal expansion silica-titania glass articles having zero crossover temperature ($T_{zc}$) gradients.

BACKGROUND

Extreme Ultra-Violet Lithography (EUVL) is a leading emerging technology for 13 nm mode and beyond for the production of Micro Processing Unit and Dynamic Random Access Memory (MPU/DRAM) integrated chips. Presently, EUVL scanners which produce these Integrated Chips (ICs) are being produced on a small scale to demonstrate this new technology. The optics systems, which include reflective optical elements, are an important part of these scanners. As EUVL development continues, the specifications continue to become more stringent for the optics system parts.

In EUVL scanners, the optical elements are exposed to an intense extreme ultraviolet (EUV) radiation. Some portion of the EUV radiation used in EUVL systems is absorbed by the reflective coatings on the optical elements of the systems, which results in the heating of the top surface of the optical element by the impinging radiation. This causes the surface of the optical element to be hotter than the bulk of the optical element and results in a temperature gradient through the optical element. In addition, in order to image a pattern on semiconductor wafers, the surface of the optical element is not uniformly heated and a complex temperature gradient is formed through the thickness of the optical element, as well as along the optical element surface receiving the radiation. These temperature gradients lead to a distortion of the optical element, which in turn leads to smearing of the image being formed on the wafers. The low thermal conductivity of materials used in optical elements in the projection systems of EUVL scanners, their large size, and the requirement of operation in vacuum, inhibit efficient heat transfer and removal. It is expected that the difficulties of heat dissipation will be exacerbated by the increased optical element sizes and the increased power levels that are anticipated to meet the demands of future EUVL developments.

SUMMARY

According to an embodiment of the present disclosure, a glass article for use in Extreme Ultra-Violet Lithography (EUVL) is provided. The glass article includes a silica-titania glass having a compositional gradient through the glass article, the compositional gradient being defined by the functions:

$$[TiO_2]=(c+f(x,y,z)), \text{ and}$$

$$[SiO_2]=(100-\{c+f(x,y,z)\}-\delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature ($T_{zc}$), $f(x, y, z)$ is a function in three-dimensional space that defines the difference in average composition of a volume element centered at the coordinates (x, y, z) with respect to c, and $\delta(x, y, z)$ is a function in three-dimensional space that defines the sum of all other components of a volume element centered at the coordinates (x, y, z).

According to another embodiment of the present disclosure, a method for forming a silica-titania glass article having a compositional gradient is provided. The method includes mixing silica precursors and titania precursors to form at least two mixed precursor compositions sufficient to form at least two glass portions, each of the at least two glass portions having different silica and titania concentrations. The method further includes converting with at least two burners the at least two mixed precursor compositions into at least two silica-titania soot compositions, and depositing the at least two silica-titania soot compositions in a vessel. The method further includes consolidating the at least two silica-titania soot compositions to form a silica-titania glass article having the at least two glass portions having different silica and titania concentrations.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The disclosure will be understood more clearly from the following description and from the accompanying figures, given purely by way of non-limiting example, in which.

DETAILED DESCRIPTION

Figure 1:
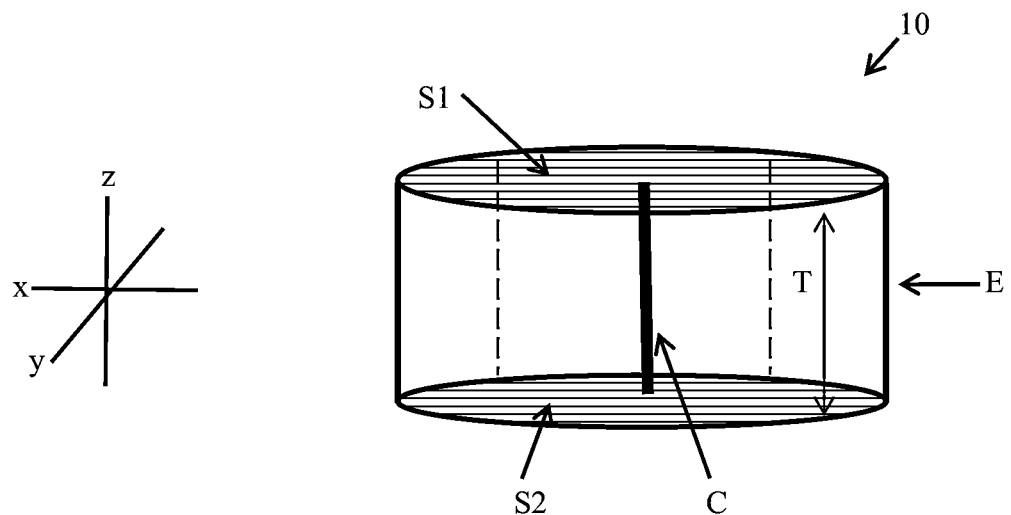
FIG. 1 illustrates a silica-titania glass article in accordance with an embodiment of the present disclosure.

Reference will now be made in detail to the present embodiment(s), an example(s) of which is/are illustrated in the accompanying drawings. Whenever possible, the same reference numerals will be used throughout the drawings to refer to the same or like parts.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

Embodiments of the present disclosure relate to silica-titania glass articles for use in EUVL and methods of preparing such silica-titania glass articles. As used with reference to the silica-titania glasses, the methods of making the silica-titania glasses, and their use in EUVL applications as described herein, the term "article" refers to, and is inclusive of, glass of any dimension, glass substrates or parts made from such glass, whether finished or unfinished, and finished optical elements for use in an EUVL system. Also as used herein, the term "zero crossover temperature ($T_{zc}$)" refers to the temperature at which the coefficient of thermal expansion of volume of material of substantially uniform composition is equal to zero. When referring to a non-uniform volume, $T_{zc}$ refers to the average $T_{zc}$ over that volume.

EUVL systems are reflective systems in which EUV light bounces from one reflective element to another. An exemplary EUVL system may contain a pair of condenser mirrors, an object such as a mask, and a plurality of projection mirrors. All of the foregoing optical elements typically have a multi-layer coating, for example a Mo/Si coating, deposited on the article to reflect the incident light. At least some of the optical elements may be formed from a glass having a low coefficient of thermal expansion (CTE) such as Ultra Low Expansion (ULE®) glass commercially available from Corning Incorporated, Corning, N.Y.

FIG. 1 illustrates a silica-titania glass article 10 having a first surface S1 and a second surface S2 lying in separate parallel planes separated by a thickness T. The glass article 10 also has a center (denoted by vertical line C) and an edge E perpendicular to the first surface Si and the second surface S2.

Figure 2:
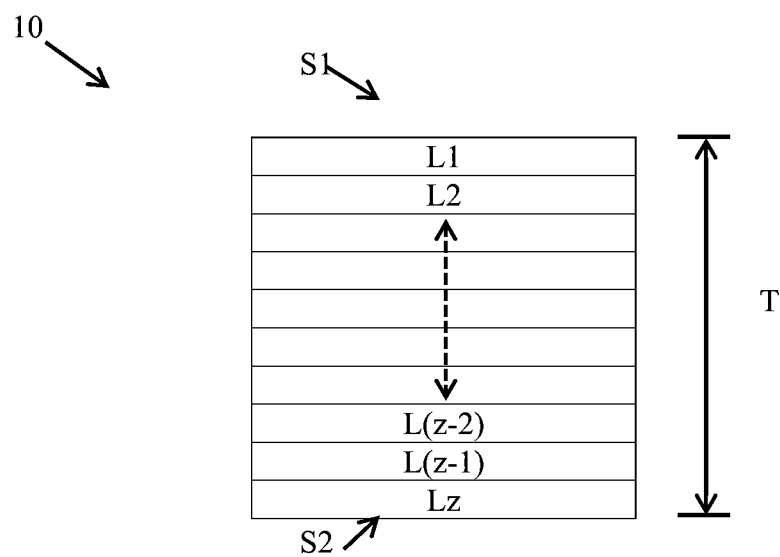
FIG. 2 illustrates a silica-titania glass article having a series of glass layers L1 to Lz in accordance with an embodiment of the present disclosure.

FIG. 2 illustrates an embodiment of a glass article 10 having a series of glass layers L1 to Lz (where z is an integer representing the number of layers L) each having different compositions and lying between the first surface S1 and the second surface S2, where the first surface S1 and the second surface S2 are the outer surfaces of layers L1 and Lz, respectively. For the purposes of the present disclosure, the series of layers L1 to Lz as shown in FIG. 2 will be referred to as a vertical compositional gradient through the thickness of the glass article 10. The glass article 10 also has a $T_{zc}$ gradient arising from the compositional gradient. According to an embodiment of the present disclosure, the $T_{zc}$ may decrease from layer L1 to layer Lz. Alternatively, the $T_{zc}$ may increase from layer L1 to layer Lz.

FIG. 2 illustrates a series of parallel glass planes L2 to L(z−1) that lie between layer L1 and layer Lz. The thickness of individual layers L1 to Lz can be the same, or they can vary depending on the article's intended application. For example, the thickness of the individual layers L1 to Lz may be equal to the thickness of the article divided by z. The number of layers can also vary depending on the temperatures generated in the article when irradiated by EUV radiation, or the temperature distribution in the article. For example, an EUVL optical element may have a greater thickness than another optical element and may have a greater number of layers to prevent stress in the optical element when irradiated by EUV radiation. In addition, while the articles illustrated herein have circular surfaces, the articles may be, for example, but without limitation, square, rectangular, oval, or may have a complex shape as may be demanded by certain applications. The shapes can be formed by various means, for example, but not limited to, by using a saw or a water jet to form the shape.

For purposes of illustration, FIG. 2 shows the glass article 10 as being plano-plano article; that is, an article having two flat and parallel surfaces. However, it is common for finished glass articles used in EUVL applications to have a curvature machined into the reflective surface. Generally when the glass article is machined, more material is removed from near the center of the glass article than is removed from near the edge potion of the glass article. If the curvature is machined into a plano-plano article having a vertical compositional gradient, the removal of material to create the curvature will result in a lack of uniformity of the gradient. To counter this effect of material removal, the glass article may be "reformed" or "slumped" to form a shape that can have a curvature machined into the reflective surface without altering the uniformity of the vertical compositional gradient. The radial concentration of titania in the layer having the reflective surface may also be adjusted so that the titania concentration of the layer is greater near the center of the glass article than near the edge of the glass article. Thus, when the curvature is machined into the layer having the reflective surface, the titania concentration remains uniform throughout the entire surface of the layer.

Based on the heat load on an optical element, the temperature gradient that will be created in the bulk of the optical element can be determined by using the thermal conductivity of the silica-titania glass, the placement and performance of heat removal devices and knowledge of the surrounding environment. For example, Corning Code 7972 ULE® glass has a published thermal conductivity of 1.31 W/(m·° C.) at room temperature, and moderately increases with increasing temperature. Using the calculated temperature gradient, a $T_{zc}$ profile that will minimize distortions of the glass caused by the temperature gradient can be obtained.

Table I illustrates an example of a temperature profile of a conventional glass article when used as an optical element in an EUVL system. As shown in the table, the glass article has a simple linear profile in which the surface receiving EUV radiation has a surface temperature of about 40° C., the surface farthest from the radiation receiving surface has a temperature of about 35° C. and the portions of the glass article between the radiation receiving surface and the surface farthest from the radiation receiving surface have intermediate temperatures. Table II illustrates a $T_{zc}$ profile through the thickness of the glass article that will minimize distortion of the glass article due to the temperature profile that is formed as a result of the impinging radiation. Table III illustrates a titania profile through the thickness of the glass article that will provide the $T_{zc}$ profile as illustrated in Table II.

TABLE I

Temperature Profile of Conventional Glass

| |
| --- |
| T = 40° C. |
| T = 39° C. |
| T = 38° C. |
| T = 37° C. |
| T = 36° C. |
| T = 35° C. |

TABLE II

Glass $T_{zc}$ Profile To Minimize Glass Distortion

| |
| --- |
| $T_{zc}$ = 40° C. |
| $T_{zc}$ = 39° C. |
| $T_{zc}$ = 38° C. |
| $T_{zc}$ = 37° C. |
| $T_{zc}$ = 36° C. |
| $T_{zc}$ = 35° C. |

TABLE III

Glass Titania Profile To Minimize Glass Distortion (wt. %)

$TiO_2 = y$
$TiO_2 = (y - \epsilon)$
$TiO_2 = (y - 2\epsilon)$
$TiO_2 = (y - 3\epsilon)$
$TiO_2 = (y - 4\epsilon)$
$TiO_2 = (y - 5\epsilon)$ In Table III, "y" is the titania concentration in wt. %. According to the exemplary glass article illustrated in the Tables, y is the titania concentration in wt. % of glass having a $T_{zc}$ of 40° C. The symbol "$\epsilon$" is the titania concentration in mass % that changes the $T_{zc}$ by 1.0° C. The value of $\epsilon$ depends on the coefficient of thermal expansion (CTE) slope that is induced in the material through annealing or through doping with at least one dopant. For example, for a material with a CTE slope at 20° C. of 1.6 ppb/° $K^2$, the increase in titania concentration to change the zero crossover temperature from 35° C. to 40° C. would be approximately 0.08 wt. %. For a material having a lower CTE slope, for example a slope at 20° C. of 0.6 ppb/° $K^2$, the increase in titania concentration to change the $L_e$ from 35° C. to 40° C. would be approximately 0.01 wt. %. Thus, for a 5.0° C. change in $T_{zc}$, such as illustrated in Tables the value of $\epsilon$ is equal to ⅕ of the amount of titania required for the change. Although the shift in $T_{zc}$ with $\epsilon$ is nonlinear, a linear approximation may be sufficiently accurate for relatively small $T_{zc}$ shifts. Within the scope of the present disclosure, $\epsilon$ may be adjusted from layer to layer to account for this nonlinearity. As an example of this linear approximation, for a silica-titania glass having a CTE slope at 20° C. of 1 ppb/° $K^2$, the value of "$\epsilon$" that will change the $T_{zc}$ by 1.0° C. at a $T_{zc}$ of 37° C. is about 0.007 wt %.

Figure 3A:
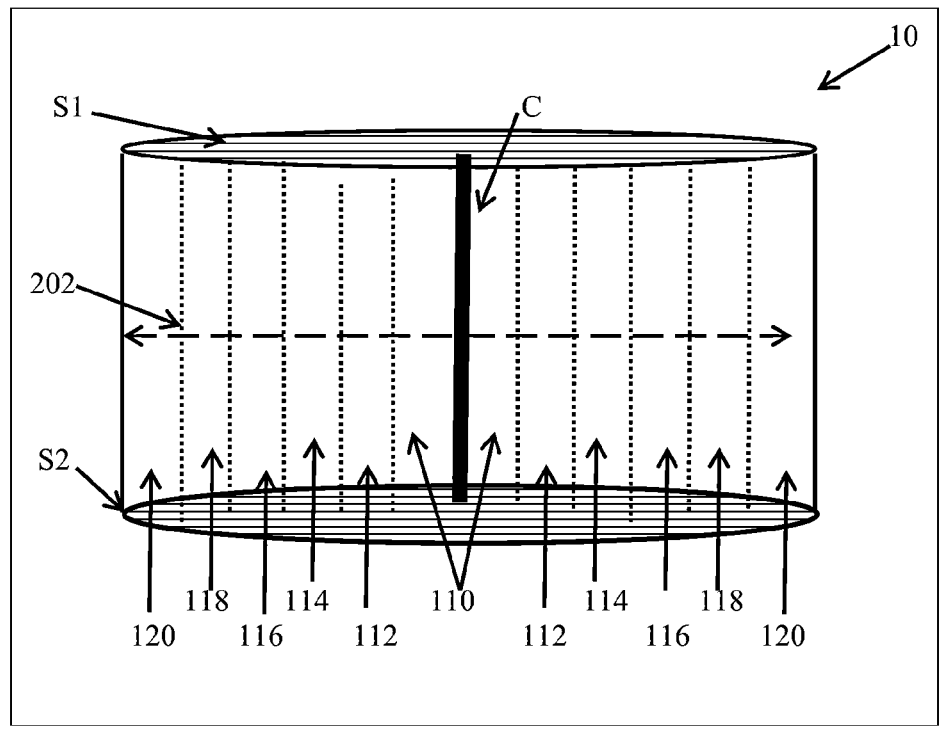
FIG. 3A is a side view of a silica-titania glass article in accordance with an embodiment of the present disclosure.
Figure 3B:
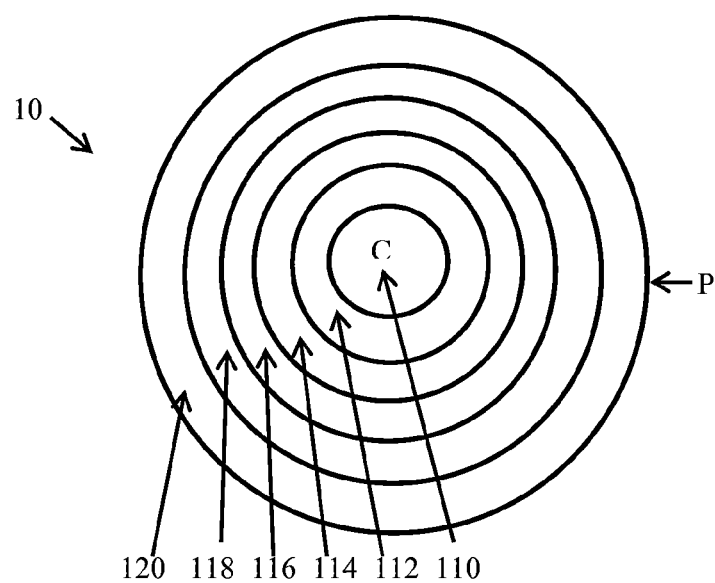
FIG. 3B is a top view of the silica-titania glass article of FIG. 3A.

FIG. 3A is a side view and FIG. 3B is a top view illustrating an embodiment of a glass article 10 having a series of glass sections 110 to 120 (indicated by the dotted lines in FIG. 3A) each having different compositions and lying between the center C and the edge E of the glass article 10. For the purposes of the present disclosure, the series of glass sections 110 to 120 as shown in FIGS. 3A and 3B will be referred to as a horizontal compositional gradient across the horizontal axis 202 of the glass article 10, where the horizontal compositional gradient extends from the center C to the edge E. The glass article 10 shown in FIGS. 3A and 3B also has a $T_{zc}$ gradient arising from the compositional gradient. According to an embodiment of the present disclosure, the $T_{zc}$ may decrease from section 110 to section 120. Alternatively, the $T_{zc}$ may increase from section 110 to section 120.

In an embodiment where the $T_{zc}$ decreases across the horizontal axis 202 from the center C to the edge E of the glass article 10, the titania concentration decreases from y at section 110 to y−5$\epsilon$ at section 120 as is illustrated in FIGS. 3A and 3B. Table IV correlates the linear approximation of the titania profile of Table III to the glass sections in FIGS. 3A and 3B.

TABLE IV

| Glass $T_{zc}$ Profile To Minimize Glass Distortion | Glass Titania Profile To Minimize Glass Distortion (wt. %) | Glass Section |
|---|---|---|
| $T_{zc} = 40°$ C. | $TiO_2 = y$ | 110 |
| $T_{zc} = 39°$ C. | $TiO_2 = (y - \epsilon)$ | 112 |
| $T_{zc} = 38°$ C. | $TiO_2 = (y - 2\epsilon)$ | 114 |
| $T_{zc} = 37°$ C. | $TiO_2 = (y - 3\epsilon)$ | 115 |
| $T_{zc} = 36°$ C. | $TiO_2 = (y - 4\epsilon)$ | 118 |
| $T_{zc} = 35°$ C. | $TiO_2 = (y - 5\epsilon)$ | 120 |

In a further embodiment the glass article 10 has both a horizontal compositional gradient and a vertical compositional gradient. Since both the horizontal and vertical gradients are varying during the deposition process, the compositional gradient and the $T_{zc}$ gradient are more complex than in embodiments having a unidirectional compositional gradient. Table V, which uses the data from Table III, is an exemplary embodiment in which titania decreases in both the horizontal direction from section 110 to section 120, and in the vertical direction from layer L1 to layer Lz. The glass article 10 illustrated in Table V has layer L1 which has a surface S1 that receives EUV radiation where the temperatures from glass section 110 to glass section 120 in layer L1 will be the highest relative to the same glass sections in layers L2 to L6.

In order to simplify the example, titania decreases at a higher rate along a 45° diagonal from L1-110 to L5-120 than the rate titania decreases either vertically or horizontally. Diagonals parallel to and above and below the L1-110 to Lz-120 diagonal show a similar rate of change. As shown in Table V, the rate of change in the titania content is the sum of the vertical axis change and the horizontal axis change. For example, box L6-120 of Table V has a titania change of y−10$\epsilon$ and a $\Delta = -10°$ C.

TABLE V

| H→ V↓ | 110 | 112 | 114 | 116 | 118 | 120 |
|---|---|---|---|---|---|---|
| L1 | y %, $\Delta T = 0°$ C. | (y-ε) %, $\Delta T = -1°$ C. | (y-2ε) %, $\Delta T = -2°$ C. | (y-3ε) %, $\Delta T = -3°$ C. | (y-4ε) %, $\Delta T = -4°$ C. | (y-5ε) %, $\Delta T = -5°$ C. |
| L2 | (y-ε) %, $\Delta T = -1°$ C. | (y-2ε) %, $\Delta T = -2°$ C. | (y-3ε) %, $\Delta T = -3°$ C. | (y-4ε) %, $\Delta T = -4°$ C. | (y-5ε) %, $\Delta T = -5°$ C. | (y-6ε) %, $\Delta T = -6°$ C. |
| L3 | (y-2ε) %, $\Delta T = -2°$ C. | (y-3ε) %, $\Delta T = -3°$ C. | (y-4ε) %, $\Delta T = -4°$ C. | (y-5ε) %, $\Delta T = -5°$ C. | (y-6ε) %, $\Delta T = -6°$ C. | (y-7ε) %, $\Delta T = -7°$ C. |
| L4 | (y-3ε) %, $\Delta T = -3°$ C. | (y-4ε) %, $\Delta T = -4°$ C. | (y-5ε) %, $\Delta T = -5°$ C. | (y-6ε) %, $\Delta T = -6°$ C. | (y-7ε) %, $\Delta T = -7°$ C. | (y-8ε) %, $\Delta T = -8°$ C. |
| L5 | (y-4ε) %, $\Delta T = -4°$ C. | (y-5ε) %, $\Delta T = -5°$ C. | (y-6ε) %, $\Delta T = -6°$ C. | (y-7ε) %, $\Delta T = -7°$ C. | (y-8ε) %, $\Delta T = -8°$ C. | (y-9ε) %, $\Delta T = -9°$ C. |
| L6 | (y-5ε) %, $\Delta T = -5°$ C. | (y-6ε) %, $\Delta T = -6°$ C. | (y-7ε) %, $\Delta T = -7°$ C. | (y-8ε) %, $\Delta T = -8°$ C. | (y-9ε) %, $\Delta T = -9°$ C. | (y-10ε) %, $\Delta T = -10°$ C. |

According to embodiments of the present disclosure, layer L1, or any layer configured to receive the incident EUV radiation, may have a $T_{zc}$ in the range of about 0° C. to about 100° C. Alternatively, layer L1, or any layer configured to receive the incident EUV radiation, may have a $L_{zc}$ in the range of about 10° C. to about 80° C. or in the range of about 10° C. to about 60° C.

According to embodiments of the present disclosure, the glass article may have a titania concentration of about 3.0 wt. % to about 12 wt. %, with the remainder being silica. The titania concentration may be in the range of about 4.0 wt. % to about 10 wt. %, or even in the range of about 5.0 wt. % to about 9.0 wt. %.

According to embodiments of the present disclosure, the glass article may have an [OH] content of less than or equal to about 1200 ppm. The [OH] content may be less than or equal to about 1000 ppm, or even less than or equal to about 900 ppm.

According to embodiments of the present disclosure, the glass article may have a fictive temperature of less than or equal to about 1100° C. The fictive temperature may be less than or equal to about 1000° C., or less than or equal to about 900° C.

According to embodiments of the present disclosure, the glass article may have a $Ti^{+3}$ content of less than or equal to about 5.0 wt. ppm. The $Ti^{+3}$ content of the glass article may be less than or equal to about 3.0 wt. ppm.

According to embodiments of the present disclosure, the glass article may have a birefringence of less than about 25 nm/cm. The birefringence may be less than about 20 nm/cm, or even less than about 10 nm/cm.

According to embodiments of the present disclosure, the glass article may have an internal transmittance of at least about 80%/cm over the wavelength range of about 0.50 µm to about 2.1 µm.

According to embodiments of the present disclosure, at least one layer L1 to Lz of the glass article may include at least one dopant. The dopant may be, but is not limited to, fluorine, OH, oxides of aluminum, boron, sodium, potassium, magnesium, calcium, lithium and niobium, and combinations thereof.

Figure 4:
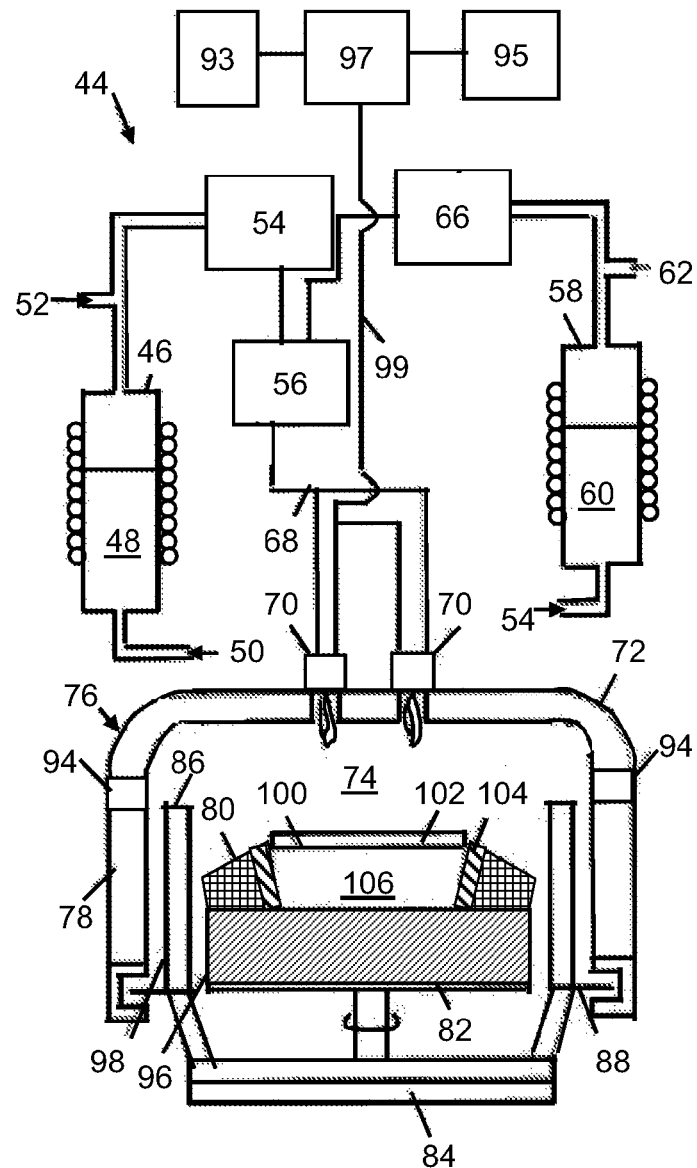
FIG. 4 illustrates an apparatus for making a silica-titania glass article in accordance with an embodiment of the present disclosure.

FIG. 4 illustrates an apparatus for making, depositing and consolidating silica-titania soot in a vessel. Using this apparatus the soot can either be: (a) collected and consolidated in one step (the direct method); or (b) collected in a first step and consolidated in a second step (the indirect or soot-to-glass method). The direct process has been described in U.S. Pat. Nos. 8,541,325, RE41,220 and 7,589,040, and the indirect process has been described in U.S. Pat. No. 6,487,879, the specifications of which are incorporated by reference in their entirety. Apparatuses described in U.S. Pat. No. RE40,586 and U.S. Patent Application No. 2011-0207593, the specifications of which are incorporated by reference in their entirety, may also be used.

The apparatus illustrated in FIG. 4 can be used to form silica-titania glass articles having a diameter in the range of about 0.20 meters to about 2.0 meters, or larger, and a thickness in the range of about 10 cm to about 30 cm. The size of the apparatus and article being formed will affect the number of burners used. Using FIG. 4 and the direct method as an example, a source 46 of a silica precursor 48 and a source 58 of a titania precursor 60 are provided. The silica precursor 48 and titania precursor 60 may be siloxanes, alkoxides, and tetrachlorides. For example, the silica precursor may be octamethylcyclotetrasiloxane (OMCTS), and the titania precursor may be titanium isopropoxide ($Ti(OPri)_4$). The sources 46, 58 may be vaporizers, evaporation tanks, or other equipment suitable for converting the precursors 48, 60 into vapor form. A carrier gas 50, such as nitrogen, is introduced at or near the base of source 46. The carrier gas 50 entrains the vapors of the silica precursor 48 and passes through a distribution system 54 to a mixing manifold 56. A by-pass stream of carrier gas is introduced at 52 to prevent saturation of the vaporous silica precursor stream. A stream of inert gas 62, e.g., nitrogen, can be brought into contact with the vaporous titania precursor to prevent saturation of the vapors. An inert carrier gas 64, e.g., nitrogen, entrains the titania precursor 60 vapors and carries the vapors through a distribution system 66 to the mixing manifold 56, where they are mixed with the silica precursor 48 vapors. Alternatively, the titania precursor 60 and the silica precursor 48 may be delivered to the mixing manifold 56 in liquid form. The mixture in the mixing manifold 56 passes through heated fume lines 68 to the burners 70 mounted on the furnace crown 72. In this illustration, two burners 70 are shown. However, more than two burners can be used to allow for better heat control and distribution of material across the deposition cavity 74. The furnace 76 may have rotation and oscillation capabilities and may include a stationary wall 78, which supports the crown 72. A containment vessel 80 is disposed within the stationary wall 78. The containment vessel 80 includes a base 82 which is supported for rotation and which also oscillates through its attachment to an oscillation table 84. The containment vessel 80 is surrounded by an air flow wall 86 which is mounted on the oscillation table 84. A motion accommodating seal 88 is formed between the stationary wall 78 and the containment vessel 80. The deposition cavity 74 is vented by a plurality of draft ports 94 formed at the top of the stationary wall 78. The draft ports 94 are connected to a suitable exhaust system (not shown) by ducting which creates a negative pressure in the deposition cavity 74 with respect to ambient pressure. Fuel 93 and oxygen 95 are premixed in the premixing chamber 97 and then transferred to the burners 70 through fume lines 99. The burners 70 ignite the fuel/oxygen mixture to produce a flame which heats the deposition cavity 74. The vaporous reactants injected into the burners 70 exit the burners 70 where they react and form titania-doped silica particles. The soot is directed downwardly and deposited on a planar surface 100, as shown at 102. The planar surface 100 may be provided by filling the liner 104 of the containment vessel 80 with cleaned cullet 106, although other means of providing a planar surface, such as a glass plate, may also be used. As the soot is deposited, the containment vessel 80, and hence the planar surface 100, is rotated and oscillated through the base 82 to improve homogeneity of the doped silica glass. During soot deposition, the furnace 76 is drafted with ambient air. The temperature of the deposition cavity 74 is monitored and held at desired processing temperatures by adjusting the vertical position of the containment vessel 80. In the direct process the temperature is maintained at a consolidation temperature so that the silica-titania particles are formed and consolidate into glass substantially simultaneously. Such time may be less than about 3.0 seconds and typically is less than about 2.0 seconds. After the glass is consolidated, it can be annealed in the same furnace according to an annealing cycle described herein, or the glass can be removed from the furnace and annealed at a later time.

As described above, reductions in CTE slope may be induced in the glass article through annealing or through doping with a dopant, wherein the dopant may be, but is not limited to, fluorine, OH, oxides of aluminum, boron, sodium, potassium, magnesium, calcium, lithium and niobium, and combinations thereof. Once the glass article is formed, it is annealed, and adjustments in the annealing schedule can be used to fine-tune the $T_{zc}$ of the glass article, and to stabilize the compositional gradient(s) and the $T_{zc}$ gradient(s) in the glass article.

Figure 6:
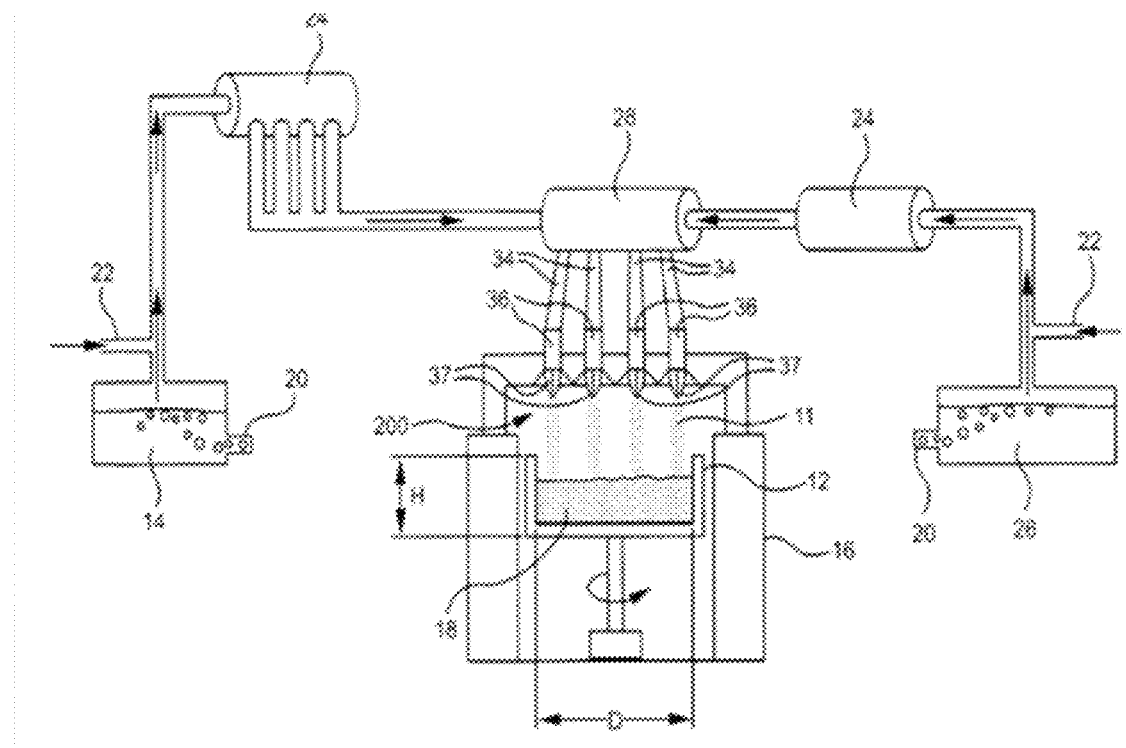
FIG. 6 illustrates an apparatus for making a silica-titania glass article in accordance with an embodiment of the present disclosure.

FIG. 6 illustrates another apparatus for forming silica-titania glass articles as described herein. As shown, the apparatus includes a source of a silica precursor 14 and a source of a titania precursor 26. A carrier gas 20, such as nitrogen, is introduced at or near the base of the source of a silica precursor 14 and a source of a titania precursor 26 to entrain the vapors of the silica precursor 14 and the titania precursor 26 and carry the vapors through distribution systems 24 and to mixing manifold 28. A stream of inert gas 22, e.g., nitrogen, may also be brought into contact with the vaporous silica and titania precursors to prevent saturation of the vapors. The mixture in the mixing manifold 28 passes through conduits 34 to burners 36 mounted in an upper portion of the furnace 16. The burners produce burner flames 37 and the mixture is delivered to a conversion site 200 where it is converted into soot particles 11. The soot particles 11 are deposited in a revolving collection cup 12 and onto an upper surface of a silica-titania glass body 18 inside the furnace 16 where the soot particles consolidate into a silica-titania glass article. As illustrated, the cup 12 may have a circular diameter shape of between about 0.20 meters and about 2.0 meters so that the glass body 18 is a cylindrical body having a diameter D between about 0.20 and about 2.0 meters and a height H between about 10 cm and about 30 cm. While these are common dimensions, they are not meant to be limiting, and it should be appreciated that the glass articles described herein may have any dimensions, and that the apparatuses to form the glass articles may be modified to form glass articles having any dimensions.

According to embodiments of the present disclosure, a method for forming silica-titania glass articles as described herein includes controlling the flow pattern of individual raw materials. The method may further include controlling the flame temperature, as well as the furnace temperature, by adjusting the fuel gas/oxygen ratio supplied to individual burners. The flow pattern of raw materials and gas/oxygen for individual burners varies with time as the glass article is formed, and this variation is monitored and carefully controlled.

According to an embodiment of the present disclosure, forming a silica-titania glass article having a vertical compositional gradient as described in Table III and as illustrated in FIG. 2 includes adjusting the flow of the titania precursor to form layers of varying titania concentration. For example, when the titania content of a layer of glass is being increased, the carrier gas rate and/or the temperature of the titania precursor in source 58 may be increased to supply additional titania to the burners. The silica precursor may be either held constant or may also be adjusted so that a predetermined ratio of silica to titania is obtained in the layer being formed. Alternatively, the amount of silica precursor being injected into the mixing manifold remains the same and only the amount of titania precursor being injected into the burner is increased.

As an example of forming a glass article as described above and having a CTE slope of about 1.6 ppb/° $K^2$ at 20° C., the titania concentration for a $T_{zc}$ of 35° C. is about 7.72%, and the titania concentration for a $T_{zc}$ of 40° C. is about 0.08 wt. % higher. As a result, using the linear approximation it can be determined that $\epsilon=0.016$, and the titania concentration for the layers having $T_{zc}$ between 35° C. and 40° C. are shown in Table VI. While these values relate to a glass article having a CTE slope of about 1.6 ppb/° $K^2$ at 20° C., an annealing cycle and/or the addition of dopants to the glass article may produce a CTE slope other than 1.6 ppb/° $K^2$ at 20° C. which would dictate different titania concentrations for the layers having $T_{zc}$ between 35° C. and 40° C.

TABLE VI

| Glass $T_{zc}$ Profile | Glass Titania Profile (wt. %) |
|---|---|
| $T_{zc}$ = 40° C. | 7.780 |
| $T_{zc}$ = 39° C. | 7.784 |
| $T_{zc}$ = 38° C. | 7.768 |
| $T_{zc}$ = 37° C. | 7.752 |
| $T_{zc}$ = 36° C. | 7.736 |
| $T_{zc}$ = 35° C. | 7.720 |

While the foregoing example discusses first depositing the layer having the lowest titania concentration and lastly depositing the layer having the highest titania concentration, the soot deposition may be carried out in the reverse manner. For example, the method may begin with the deposition of the layer having the highest titania concentration and ending with the layer having the lowest titania concentration. When this method of deposition is used the carrier gas rate and/or the temperature of the titania precursor in source 58 is decreased so that the titania concentration of the layers decreases as they are deposited.

Figure 5:
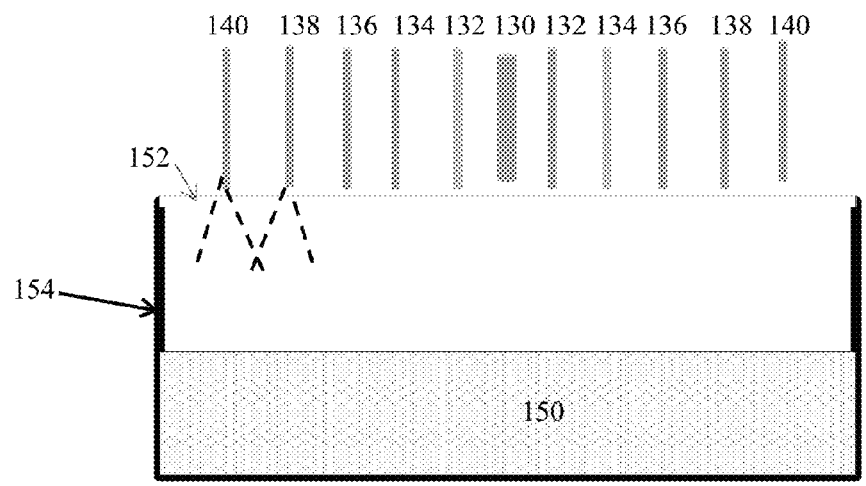
FIG. 5 is a simple diagram of an apparatus for making a silica-titania glass article in accordance with an embodiment of the present disclosure.

FIG. 5 is a simple diagram illustrating one configuration of a plurality of burners 130 to 140 that can be used to produce a glass article 150 having a horizontal compositional gradient. The configuration of burners shown in FIG. 5 includes a single burner 130 at the center of the glass article 150 and five pairs of burners 132-140. While the configuration shown in FIG. 5 could be used to form, for example, a glass article 10 having six glass sections 110 to 120 having different compositions, the configuration of burners may include, in addition to a single burner located at the center of the glass article, any number of pairs of burners. The combination of the single burner at the center of the glass article and the number of pairs of burners is equal to a predetermined number of glass sections in the glass article having different compositions. For example, to form a glass article having eight glass sections, a configuration of burners having a single burner at the center of the glass article and seven pairs of burners may be used.

As shown, silica-titania soot may be deposited into vessel 154. FIG. 5 further illustrates an ejection pattern 152 of soot from burners 130 to 140. Such ejection pattern 152 provides soot deposition overlap which achieves a smooth gradient across the horizontal axis. To form a glass article 150 having a horizontal compositional gradient, different silica and titania precursor mixtures are supplied to each burner. For example, the mixture having the highest titania concentration may be supplied to burner 130 and the mixture having the lowest titania concentration may be supplied to burner 140 with mixtures having intermediate titania concentration being supplied to burners 132 to 138. Alternatively, the mixture having the highest titania concentration may be supplied to burner 140 and the mixture having the lowest titania concentration may be supplied to burner 130 with mixtures having intermediate titania concentration being supplied to burners 132 to 138. In the system shown in FIG. 5, the glass sections 110-120 are deposited simultaneously.

It should be noted that while layers L1 to Lz and glass sections 110 to 120 are described herein as discrete entities with finite thickness and finite differences in $T_{zc}$, layers L1 to Lz and glass sections 110 to 120 may be of infinitesimal thickness, thus effectively resulting in a glass article where $T_{zc}$ changes continuously and no independent layers can be physically identified. Such a glass article may be formed by continuously varying the titania or silica precursor concentration to the burners, and this teaching is applicable to each of the embodiments described herein.

According to embodiments of the present disclosure, a glass article for use in EUVL is provided. The glass article includes a silica-titania glass having a compositional gradient through the glass article, the compositional gradient being defined by the functions:

$$[TiO_2]=(c+f(x,y,z)), \text{ and}$$

$$[SiO_2]=(100-\{c+f(x,y,z)\}-\delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature $(T_{zc})$, f(x, y, z) is a function in three-dimensional space that defines the difference in average composition of a volume element centered at the coordinates (x, y, z) with respect to c, and $\delta$(x, y, z) is a function in three-dimensional space that defines the sum of all other components of a volume element centered at the coordinates (x, y, z).

In embodiments having a vertical compositional gradient, f(x, y, z) is independent of x and y, such that the glass article has a unidirectional gradient along the z axis. Alternatively, f(x, y, z) may be independent of z and y, such that the glass article has a unidirectional gradient along the horizontal x axis. In embodiments having a vertical compositional gradient, f(x, y, z) is independent of x and z, such that the glass article has a unidirectional gradient along the y axis. Other unidirectional gradients can be generated along any arbitrary axis in three dimensions, in which case f(x, y, z) will be constant within planes perpendicular to that axis.

According to embodiments of the present disclosure, f(x, y, z) may be a stepped function along at least one axis, such that the glass article has a layered structure with discrete variations in composition between adjacent layers. The steps in the stepped function may be of constant amplitude. In further embodiments, the stepped function may be monotonic. In further embodiments, the glass article may include continuous curves such that f(x, y, z)=c, where c is a constant, can be defined in the (x,y) plane, thus resulting in a glass article having layers in the shape of generalized cylindrical surfaces of constant composition. In further embodiments, the constant c may have discrete values.

According to an embodiment of the present disclosure, a glass article for EUVL is provided. The article has a titania compositional gradient through the glass, the compositional gradient being formed by a plurality of silica-titania layers in the order L1 to Lz, the layers having different silica-titania compositions in which L1 has the highest titania concentration, Lz has the lowest titania concentration and the layers between L1 and Lz have intermediate titania compositions. The composition of the layers Ln being:

$$[TiO_2]=(y-n\epsilon)$$

$$[SiO_2]=100-(y-n\epsilon)-\delta$$

wherein $[TiO_2]$ is the concentration of titania in wt. %, $[SiO_2]$ is the concentration of silica in wt. %, y is the titania concentration in wt. % for a predetermined $T_{zc}$, n is an integer varying between 1 and z, z is an integer greater than 2, $\epsilon$ is the amount of titania that will change the $T_{zc}$ value by 1° C., and $\delta$ is the sum of all other components, which in this example is considered to be constant within the glass article. The glass article has a $T_{zc}$ gradient arising from the compositional gradient, where the $T_{zc}$ gradient decreases from L1 to Lz. According to embodiments of the present disclosure, L1 and Lz may be the layers farthest apart from one another and the order of the layers in the glass article may be L1 to Lz. In such embodiments the compositional gradient is a vertical compositional gradient through the thickness of the glass from the outer surface S1 of layer L1 to outer surface S2 of layer Lz distal from S1. In such embodiments, outer surface S1 may be configured to receive incident EUV radiation.

According to another embodiment of the present disclosure, the glass article has a first surface S1, a second surface S2 distal from, and parallel to, the first surface S1, and a thickness T between surface S1 and surface S2. The glass article also has a center C, and an edge E around the article, both of the center C and the edge E extending from the first surface S1 to the second surface S2. The glass article has a compositional gradient that is a horizontal compositional gradient extending from the center C to the edge E, in which portions of the article closest to center C have the highest titania concentration, portions of the article closest to edge E have the lowest titania concentration and the portions of the article between center C and edge E have intermediate titania compositions. The glass article has a $T_{zc}$ gradient arising from the compositional gradient, where the $T_{zc}$ gradient decreases from center C to edge E.

According to another embodiment of the present disclosure, the glass article has a first surface S1, a second surface S2 distal from, and parallel to, the first surface S1, and a thickness T between surface S1 and surface S2 with layers L1 to Lz extending along thickness T from surface S1 to surface S2. The glass article also has a center C, and an edge E around the article, both of the center C and the edge E extending from the first surface S1 to the second surface S2. The glass article has a vertical compositional gradient, a horizontal compositional gradient, and a plurality of diagonal compositional gradients. The vertical compositional gradient extends from layer L1 to layer Lz. The horizontal compositional gradient extends along from the center C to the edge E. The plurality of diagonal compositional gradients extend diagonally through the article from the first surface S1 at center C to the second surface S2 at edge E.

According to an embodiment of the present disclosure, a method for forming a silica-titania glass article having a compositional gradient is provided. The method includes mixing silica precursors and titania precursors to form at least two mixed precursor compositions sufficient to form at least two glass portions, each of the at least two glass portions having different silica and titania concentrations. The method further includes converting with at least two burners the at least two mixed precursor compositions into at least two silica-titania soot compositions, and depositing the at least two silica-titania soot compositions in a vessel. The method further includes consolidating the at least two silica-titania soot compositions to form a silica-titania glass article having the at least two glass portions having different silica and titania concentrations.

The method may include sequentially depositing each of the at least two silica-titania soot compositions in the vessel. The method may also include sequentially supplying the at least two mixed precursor compositions to the at least two burners. Such sequential supplying to the burners and/or such sequential depositing of each of the at least two soot compositions can be used to form, for example, the plurality of layers in the order L1 to Lz, and a corresponding vertical compositional gradient as described above.

According to embodiments of the present disclosure, the method may include simultaneously depositing each of the at least two silica-titania soot compositions in the vessel. The method may also include supplying each of the at least two mixed precursor compositions to one of the at least two burners. Such simultaneous supplying to the burners and/or such simultaneous depositing of each of the at least two soot compositions can be used to form, for example, the plurality of glass sections 110 to 120, and a corresponding horizontal compositional gradient, as described above.

According to embodiments of the present disclosure, the method may include simultaneously depositing a first group of the at least two silica-titania soot compositions in the vessel to form a first layer comprising portions having different titania concentrations, and simultaneously depositing a second group of the at least two silica-titania soot compositions in the vessel to form a second layer comprising portions having different titania concentrations. The method may further include simultaneously supplying each of the at least two mixed precursor compositions of the first group to one of the at least two burners, and simultaneously supplying each of the at least two mixed precursor compositions of the second group to one of the at least two burners. Such simultaneous depositing can be used to form, for example, a glass article such as is illustrated in Table V, and corresponding horizontal, vertical and diagonal compositional gradients, as described above.

According to embodiments of the present disclosure, the method may include mixing silica precursors and titania precursors to form the at least two mixed precursor compositions sufficient to form glass portions having predetermined titania concentrations and predetermined silica concentrations of:

$$[TiO_2]=(c+f(x,y,z)), \text{ and}$$

$$[SiO_2]=(100-\{c+f(x,y,z)\}-\delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature ($T_{zc}$), f(x, y, z) is a function in three-dimensional space that defines the difference in average composition of a volume element centered at the coordinates (x, y, z) with respect to c, and $\delta$(x, y, z) is a function in three-dimensional space that defines the sum of all other components of a volume element centered at the coordinates (x, y, z).

According to embodiments of the present disclosure, the vessel may be rotated at a selected rate and translated in a downward direction at a selected rate as the glass article is being formed. The vessel may be rotated at a selected rate, translated downward at a selected rate and oscillated at a selected rate as the glass article is being formed.

The glass articles described herein, and the methods of forming such glass articles form a glass article having a desired $T_{zc}$ gradient for use in EUVL applications. The glass articles described herein can have various sizes including small articles weighing about 10 kilograms (approximately 22 pounds) and large articles weighing about 1130-2260 kilograms (approximately 2500-5000 pounds). Further, the glass articles can have uniform compositional gradients which provide a uniform $T_{zc}$ gradient which can be easily adjusted to form glass articles having a $T_{zc}$ gradient sufficient for specific applications and specific temperature gradients.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A glass article for use in Extreme Ultra-Violet Lithography (EUVL), the glass article comprising a silica-titania glass having a compositional gradient through the glass article, the compositional gradient being defined by the functions:

$$[TiO_2]=(c+f(x,y,z)), \text{ and}$$

$$[SiO_2]=(100-\{c+f(x,y,z)\}-\delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature ($T_{zc}$), f(x,y,z) is a function in three-dimensional space that defines the difference in average composition of a volume element centered at the coordinates (x,y,z) with respect to c, and $\delta$(x,y,z) is a function in three-dimensional space that defines the sum of all other components of a volume element centered at the coordinates (x,y,z); and wherein f(x,y,z) is independent of z, and the glass article comprises multidirectional variations in the x,y plane.

2. The glass article of claim 1, wherein f(x,y,z)=c, where c is a constant, and the glass article comprises layers in the shape of generalized cylindrical surfaces of constant composition.

3. The glass article of claim 2, wherein the constant c has discrete values.

4. The glass article of claim 1, wherein $[TiO_2]$ is between about 3.0 wt. % and about 12 wt. %.

5. The glass article of claim 1, wherein $[TiO_2]$ is between about 5.0 wt. % and about 9.0 wt. %.

6. The glass article of claim 1, further comprising at least one dopant selected from the group consisting of fluorine, OH, oxides of aluminum, boron, sodium, potassium, magnesium, calcium, lithium and niobium and combinations thereof.

7. A method for forming a silica-titania glass article having a compositional gradient, the method comprising:
    mixing silica precursors and titania precursors to form at least two mixed precursor compositions sufficient to form at least two glass portions, each of the at least two glass portions having different titania concentrations;
    converting with at least two burners the at least two mixed precursor compositions into at least two silica-titania soot compositions;
    depositing the at least two silica-titania soot compositions in a vessel; and
    consolidating the at least two silica-titania soot compositions to form a silica-titania glass article having a compositional gradient through the glass article, the compositional gradient being defined by the functions:

$$[TiO_2]=(c+f(x,y,z)), \text{ and}$$

$$[SiO_2]=(100-\{c+f(x,y,z)\}-\delta(x,y,z))$$

wherein $[TiO_2]$ is the concentration of titania in wt. %, $[SiO_2]$ is the concentration of silica in wt. %, c is the titania concentration in wt. % for a predetermined zero crossover temperature ($T_{zc}$), f(x,y,z) is a function in three-dimensional space that defines the difference in average composition of a volume element centered at the coordinates (x,y,z) with respect to c, and $\delta$(x,y,z) is a function in three-dimensional space that defines the sum of all other components of a volume element centered at the coordinates (x,y,z); and wherein f(x,y,z)is independentis of z, and the glass article comprises multidirectional variations in the x,y plane.

8. The method of claim 7, wherein the depositing step comprises:

simultaneously depositing a first group of the at least two silica-titania soot compositions in the vessel to form a first layer comprising portions having different titania concentrations; and simultaneously depositing a second group of the at least two silica-titania soot compositions in the vessel to form a second layer comprising portions having different titania concentrations.

9. The method of claim 7, further comprising:

simultaneously supplying each of the at least two mixed precursor compositions of the first group to one of the at least two burners; and simultaneously supplying each of the at least two mixed precursor compositions of the second group to one of the at least two burners.

10. The method of claim 7, wherein $f(x,y,z)=c$, where c is a constant, and the glass article comprises layers in the shape of generalized cylindrical surfaces of constant composition.

11. The method of claim 10, wherein the constant c has discrete values.

12. The method of claim 7, wherein $[TiO_2]$ is between about 3.0 wt. % and about 12 wt. %.

13. The method of claim 7, wherein $[TiO_2]$ is between about 5.0 wt. % and about 9.0 wt. %.

14. The method of claim 7, wherein at least one of the at least two mixed precursor compositions further comprise at least one dopant selected from the group consisting of fluorine, OH, oxides of aluminum, boron, sodium, potassium, magnesium, calcium, lithium and niobium and combinations thereof.

* * * * *